(12) United States Patent
Chen

(10) Patent No.: US 12,738,931 B2
(45) Date of Patent: Sep. 15, 2026

(54) PRE-EMPHASIS DRIVING CIRCUIT AND METHOD

(71) Applicant: TAIWAN SEMICONDUCTOR MANUFACTURING COMPANY LTD., Hsinchu (TW)

(72) Inventor: Tung-Tsun Chen, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 16 days.

(21) Appl. No.: 19/004,465

(22) Filed: Dec. 30, 2024

(65) Prior Publication Data

US 2026/0189223 A1 Jul. 2, 2026

(51) Int. Cl.
*H03K 5/14* (2014.01)
*H03K 5/131* (2014.01)

(52) U.S. Cl.
CPC ............... *H03K 5/14* (2013.01); *H03K 5/131* (2013.01)

(58) Field of Classification Search
CPC ................................ H03K 5/14; H03K 5/131
See application file for complete search history.

(56) References Cited

U.S. PATENT DOCUMENTS 8,410,818 B1 * 4/2013 Hsu ........................ H03K 3/012 326/27
11,967,958 B2 * 4/2024 Chen ........................ H03K 5/01
12,567,861 B2 * 3/2026 Khan P ............... G06F 13/4282
2003/0193351 A1 * 10/2003 Fukui ............... H03K 19/01721 326/83

OTHER PUBLICATIONS

A_15_Gb_s_Non-Return-to-Zero_Transmitter_With_1-Tap_Pre-Emphasis_Feed-Forward_Equalizer_for_Low-Power_Ground_Terminated_Memory_Interfaces. IEEE Transactions on Circuits and Systems—II: Express Briefs, vol. 69, No. 6, Jun. 2022.
A_22-Gb_s_0.95-pJ_b_Energy-Efficient_Voltage-Mode_Transmitter_With_Time-Based_Feedforward_Equalization_in_a_28-nm_CMOS. IEEE Transactions on Very Large Scale Integration (VLSI) Systems, vol. 28, No. 5, May 2020.

* cited by examiner

*Primary Examiner* — Daniel C Puentes
(74) *Attorney, Agent, or Firm* — WPAT LAW; Anthony King

(57) ABSTRACT

A driving circuit is provided. A delay circuit is configured to delay a first signal. A control circuit is configured to provide a first control signal and a second control signal according to the first signal, and provide a third control signal and a fourth control signal according to the first signal and the delayed first signal. A first driver is coupled to a pad and controlled by the first and second control signals. A second driver is coupled to the pad and controlled by the third and fourth control signals. The delay circuit, the control circuit and the second driver are powered by a first power supply voltage, and the first driver is powered by a second power supply voltage less than the first power supply voltage. The first and second control signals are the same, and the third and fourth control signals are different.

20 Claims, 10 Drawing Sheets

PRE-EMPHASIS DRIVING CIRCUIT AND METHOD

BACKGROUND

Advancements in technology continue to create challenges in designing smaller, faster and more complicated integrated circuits (ICs) having increased functionality. The physical dimensions of transistors are often reduced with each new generation of various integrated circuits. Some integrated circuits interface with external components (or ICs) that operate at different voltages than the IC, or have an effect on the integrated circuit that affects the performance of the IC. For the high-speed and low-voltage ICs, input/output (I/O) interfaces are important for the performance of the IC.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or decreased for clarity of discussion.

DETAILED DESCRIPTION

Figure 1:
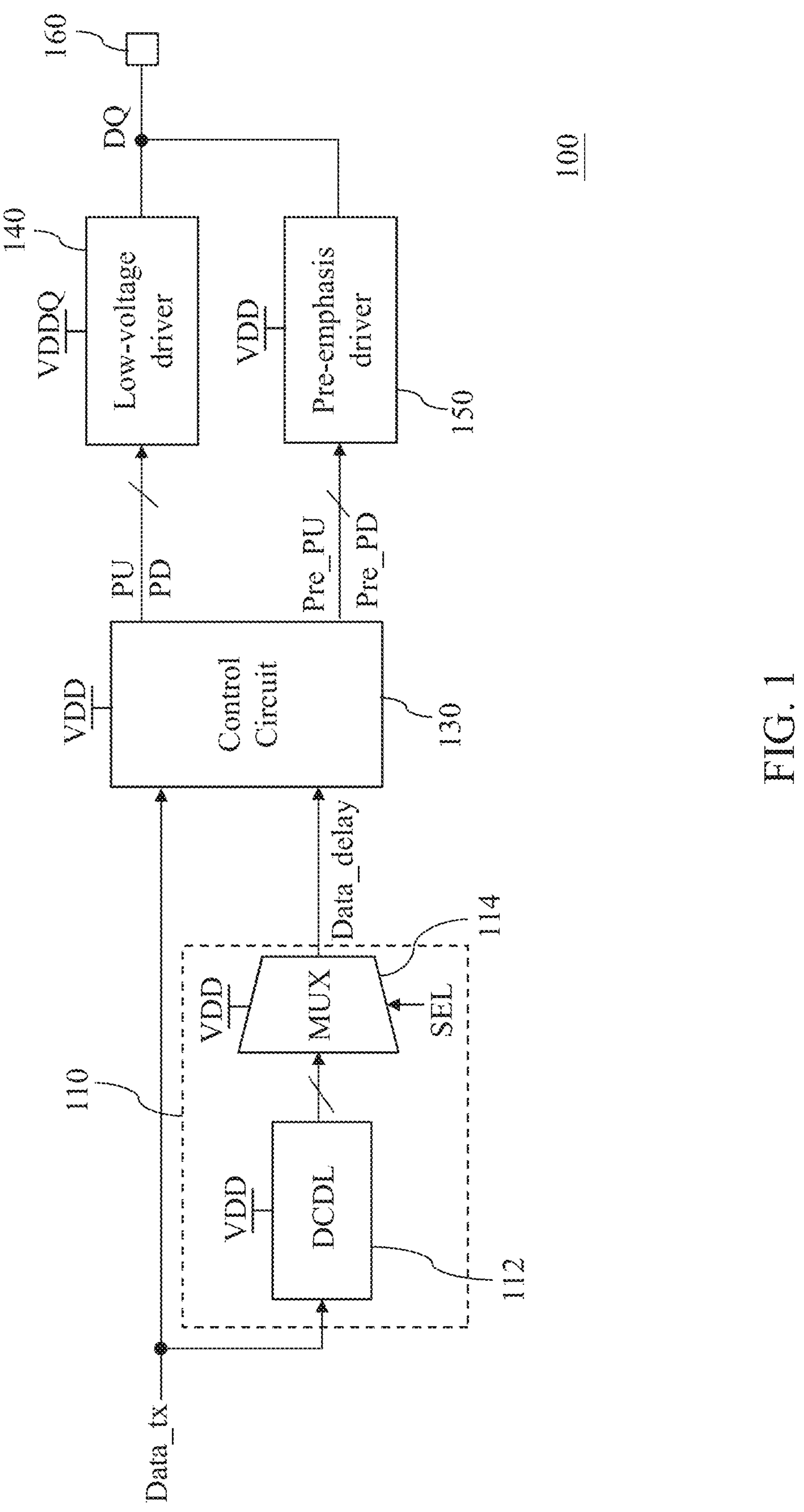
FIG. 1 is a circuit diagram of a driving circuit in an integrated circuit (IC), in accordance with some embodiments of the present disclosure.

The following disclosure provides many different embodiments, or examples, for implementing different features of the provided subject matter. Specific examples of components and arrangements are described to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

While embodiments of the present disclosure are discussed in detail, it should be appreciated that the present disclosure provides many applicable inventive concepts that can be embodied in a wide variety of specific contexts. The specific embodiments discussed are merely illustrative and do not limit the scope of the disclosure.

Further, spatially relative terms, such as "beneath", "above", "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As will be appreciated by one skilled in the art, the embodiments of the present disclosure may be implemented as a system, method, or computer program product. Accordingly, the embodiments of the present disclosure may take the form of an embodiment included entirely of hardware, an embodiment included entirely of software (including firmware, resident software, micro-code, etc.) or an embodiment combining software and hardware aspects. The various types of embodiments mentioned may all generally be referred to herein as a "circuit", "block", "module" or "system". Furthermore, the embodiments of the present disclosure may take the form of a computer program embodied in any tangible medium of expression having program codes embodied in the medium and executable by a computer.

Embodiments of pre-emphasis driving circuit and method are provided. The driving circuit includes a delay circuit, a control circuit, a low-voltage driver and a pre-emphasis driver. The delay circuit is configured to delay a signal to be transmitted to a specific device through a pad. The low-voltage driver and the pre-emphasis driver are coupled to the pad. The control circuit is configured to provide the first and second control signals to control the low-voltage driver according to the signal to be transmitted and provide the third and fourth control signals to control the pre-emphasis driver according to the signal to be transmitted and the delayed signal. By using the pre-emphasis driver, a higher power supply voltage is provided to the pad through a P-type transistor of the pre-emphasis driver during a pre-emphasis pull-up phase, and an additional pull down on the pad is provided through an N-type transistor of the pre-emphasis driver during a pre-emphasis pull-down phase, thereby steepening slopes of rising edge and falling edge of the signal in the pad.

FIG. 1 is a circuit diagram of a driving circuit 100 in an integrated circuit (IC), in accordance with some embodiments of the present disclosure. The driving circuit 100 is configured to provide an output signal DQ to a pad 160 according to the signal (or data) Data_tx to be transmitted to a specific device (not shown) through the pad 160. In some embodiments, the specific device is a low-voltage and high-speed device. In some embodiments, the driving circuit 100 is implemented as an output path in an input/output (I/O) circuit of the IC. In some embodiments, the IC and the specific device are implemented in different package devices. In some embodiments, the IC and the specific device are implemented in the same package device. In some embodiments, the IC is a master device and the specific device is a slave device. For example, the specific device is a memory and the IC is a controller for the memory. In some embodiments, the pad 160 is a bi-directional pad with the output path and the input path. To simplify the explanation, the circuits in the input path of the pad 160 are omitted.

In FIG. 1, the driving circuit 100 includes a delay circuit 110, a control circuit 130, a low-voltage driver 140 and a pre-emphasis driver 150. The delay circuit 110, the control circuit 130 and the pre-emphasis driver 150 are powered by the power supply voltage VDD, and the low-voltage driver 140 is powered by the power supply voltage VDDQ. It should be noted that the power supply voltage VDDQ is less than the power supply voltage VDD, i.e., VDDQ<VDD. The power supply voltage VDD is a core power that is a power supply voltage for the core circuit in the IC, and the power supply voltage VDD is in a range from about 0.75 volts to about 2 volts. The power supply voltage VDDQ is an I/O power that is a power supply voltage corresponding to the specific device coupled to the pad 160. In some embodiments, the power supply voltage VDDQ is in a range from about 0.4 volts to about 0.5 volts. For example, the specific device is a Low-Power Double Data Rate (LPDDR) memory and the power supply voltage VDDQ is about 0.5 volts, or the specific device is a High Bandwidth Memory (HBM) and the power supply voltage VDDQ is about 0.4 volts.

The delay circuit 110 is configured to delay the signal Data_tx so as to provide the signal Data_delay (i.e., the delayed signal Data_tx) to the control circuit 130. In some embodiments, the signal Data_tx is a digital signal having rising edge and the falling edge. In some embodiments, the rising edge and falling edge of the signal Data_tx are synchronously delayed by the delay circuit 110 to generate the signal Data_delay, i.e., the rising and falling edges of the signal Data_delay have the same delay time relative to the signal Data_tx. In some embodiments, the rising edge and falling edge of signal Data_tx are asynchronously delayed by the delay circuit 110 to generate the signal Data_delay, i.e., the rising edge and falling edge of the signal Data_delay have different delay times relative to the signal Data_tx. In the embodiment of FIG. 1, the delay circuit 110 includes a digitally controlled delay line (DCDL) 112 and a multiplexer (MUX) 114.

In other embodiments, the delay circuit 110 can be any known circuit that can be used to delay the signal Data_tx.

The control circuit 130 is configured to provide the control signals PU and PD to the low-voltage driver 140 according to the signal Data_tx. Simultaneously, the control circuit 130 is configured to provide the control signals Pre_PU and Pre_PD to the pre-emphasis driver 150 according to both the signal Data_tx and the signal Data_delay. Compared with the low-voltage driver 140, the pre-emphasis driver 150 has a strong pull up on the pad 160 due to the higher power supply voltage VDD and an additional pull down on the pad 160, so as to pre-emphasize the pull-up and pull-down of the output signal DQ.

Figure 2:
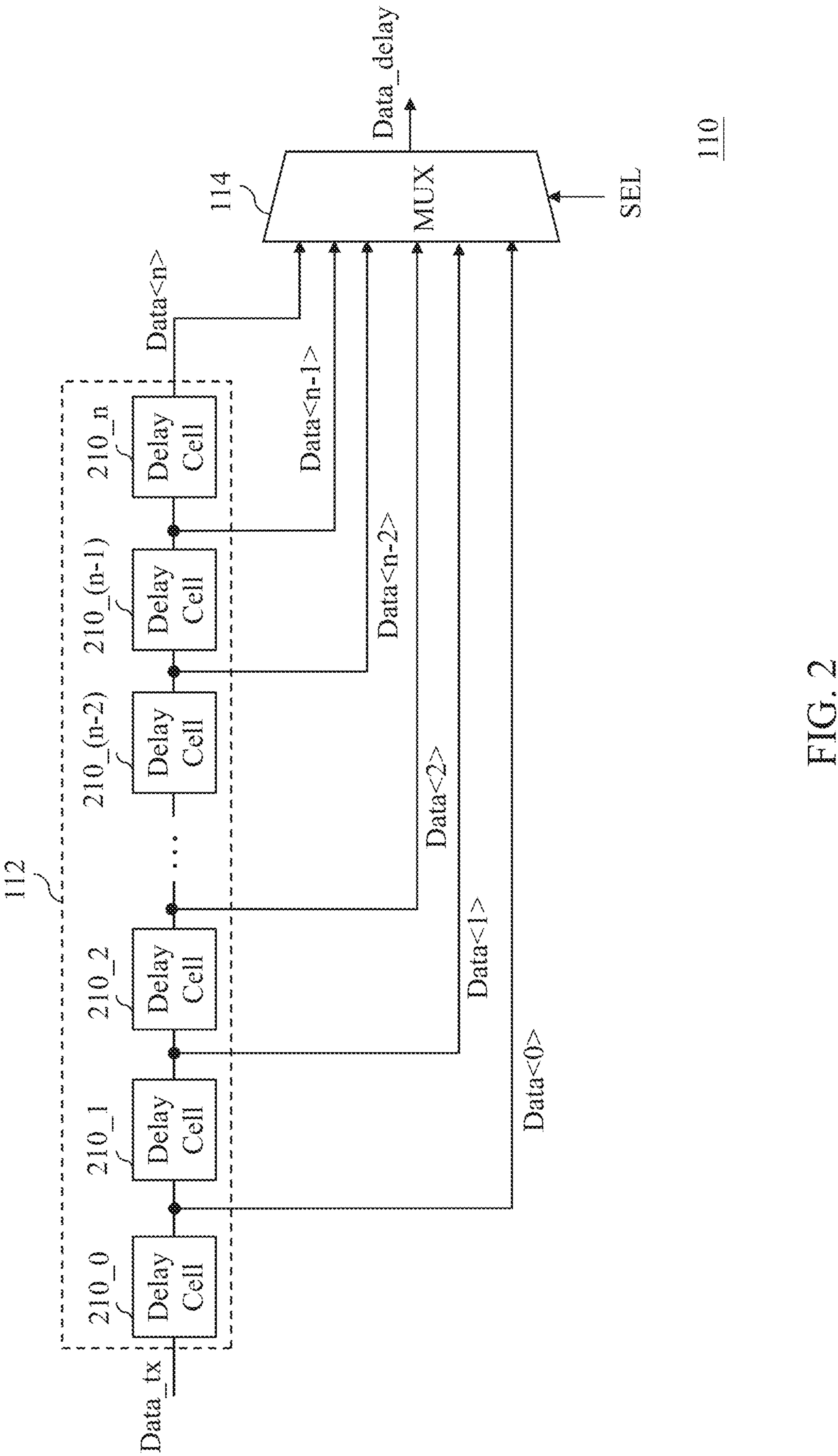
FIG. 2 is a circuit diagram of the delay circuit of FIG. 1, in accordance with some embodiments of the present disclosure.

FIG. 2 is a circuit diagram of the delay circuit 110 of FIG. 1, in accordance with some embodiments of the present disclosure. The delay circuit 110 includes the DCDL 112 and the MUX 114, and the DCDL 112 and the MUX 114 are powered by the power supply voltage VDD. The DCDL 112 includes multiple delay cells 210_0 through **210_*n* connected in series, and the DCDL 112 is configured to generate multiple delayed signals Data<0> through Data<n> according to the signal Data_tx. Each of the delay cells 210_0 through 210_*n* is configured to provide the corresponding delayed signal to the MUX 114 and the next delay cell 210. For example, the delay cell 210_0 is configured to delay the signal Data_tx so as to provide the signal Data<0> to the MUX 114 and the delay cell 210_1. The delay cell 210_1 is configured to delay the signal Data<0> so as to provide the signal Data<1> to the MUX 114 and the delay cell 210_2. The delay cell 210_2 is configured to delay the signal Data<1> so as to provide the signal Data<2> to the MUX 114 and the next delay cell 210, and so on. The DCDL 112 is capable of controlling high driving strength and is arranged in the critical data slew periods of the signal Data_tx, so as to save power. In some embodiments, the delay cells 210_0 through 210_*n*** are Process, Voltage and Temperature (PVT) correlated delay units that can vary driving strength according to PVT variation.

In some embodiments, each of delay cells 210_0 through **210_*n* is configured to introduce a constant amount of delay (e.g., a constant delay time) to the signal Data_tx. In some embodiments, each of delay cells 210_0 through 210_*n* is configured to introduce an individual amount of delay (e.g., an individual delay time) to the signal Data_tx. For example, the delay cell 210_0 is configured to introduce a maximum amount of delay to the signal Data_tx, and the delay cell 210_*n*** is configured to introduce a minimum amount of delay to the signal Data_tx.

In the embodiment of FIG. 2, the signals Data<0> through Data<n> generated by all delay cells 210_0 through **210_*n* are provided to the MUX 114. In some embodiments, only a portion of the signals Data<0> through Data<n> generated by the DCDL 112 are provided to the MUX 114. Based on the control signal (or selection signal) SEL, the MUX 114** is configured to select a signal from the signals Data<0> through Data<n> and provide the selected signal as the signal Data_delay.

In some embodiments, the rising edge and falling edge of the signal Data_tx are synchronously delayed by the delay circuit 110, i.e., the rising and falling edges of the signal Data_tx are delayed by the same delay cell. In other words, the control signal SEL is fixed for the signal Data_tx. Therefore, when the signal Data_tx changes (e.g. rises or falls), the signal Data_delay is selected from the same signal (e.g., the signal Data<1>) of the DCDL 112 through the MUX 114 by the control signal SEL.

In some embodiments, the rising edge and falling edge of signal Data_tx are asynchronously delayed by the delay circuit 110, i.e., the rising edge and falling edge of the signal Data_tx are delayed by the different delay cells. In other words, the control signal SEL is variable for the signal Data_tx. For example, the control signal SEL changes with the change of the signal Data_tx. Therefore, when the signal Data_tx rises and falls, the signal Data_delay is selected from the different signals of the DCDL 112 through the MUX 114 by the control signal SEL. For example, when the signal Data_tx rises, the MUX 114 is controlled by the control signal SEL so as to provide the signal DATA<0> as the signal Data_delay. Furthermore, when the signal Data_tx falls, the MUX 114 is controlled by the control signal SEL so as to provide the signal DATA<2> as the signal Data_delay.

Figure 3B:
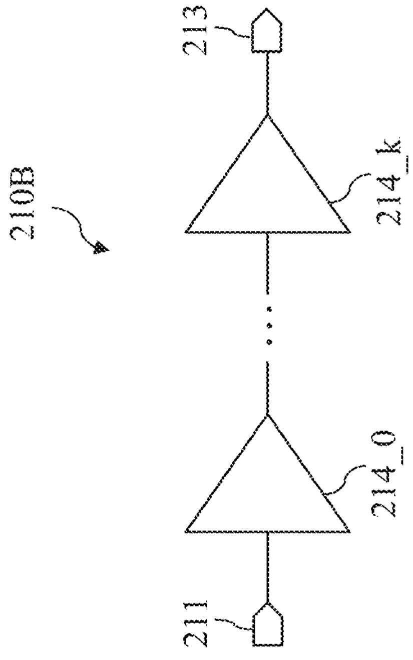
FIG. 3B is a circuit diagram of a delay cell, in accordance with some embodiments of the present disclosure.
Figure 3A:
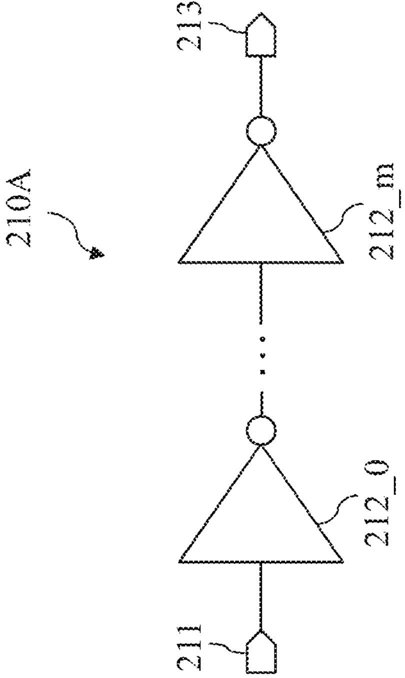
FIG. 3A is a circuit diagram of a delay cell, in accordance with some embodiments of the present disclosure.

FIG. 3A is a circuit diagram of a delay cell 210A, in accordance with some embodiments of the present disclosure. The delay cell 210A includes multiple inverters 212_0 through **212_*m* connected in series between an input terminal 211 and an output terminal 213, and the inverters 212_0 through 212_*m* are powered by the power supply voltage VDD. In some embodiments, the inverters 212_0 through 212_*m* have the same circuit configurations, i.e., the P-type transistors have the same number and the same size and the N-type transistors have the same number and the same size in the inverters 212_0 through 212_*m*. Therefore, each of inverters 212_0 through 212_*m* is configured to introduce a constant amount of delay to the signal from the input terminal 211. In some embodiments, the inverters 212_0 through 212_*m* have the different circuit configurations, i.e., the P-type transistors have different numbers or sizes and/or the N-type transistors have different numbers or sizes in the inverters 212_0 through 212_*m*. Therefore, each of inverters 212_0 through 212_*m* is configured to introduce an individual amount of delay to the signal from the input terminal 211**.

FIG. 3B is a circuit diagram of a delay cell 210B, in accordance with some embodiments of the present disclosure. The delay cell 210B includes multiple buffers 214_0 through **214_*k* connected in series between the input terminal 211 and the output terminal 213, and the buffers 214_0 through 214_*k* are powered by the power supply voltage VDD. In some embodiments, the buffers 214_0 through 214_*k* have the same circuit configurations, i.e., the P-type transistors have the same number and the same size and the N-type transistors have the same number and the same size in the buffers 214_0 through 214_*k*. Therefore, each of buffers 214_0 through 214_*k* is configured to introduce a constant amount of delay to the signal from the input terminal 211. In some embodiments, the buffers 214_0 through 214_*k* have the different circuit configurations, i.e., the P-type transistors have different numbers or sizes and/or the N-type transistors have different numbers or sizes in the buffers 214_0 through 214_*k*. Therefore, each of buffers 214_0 through 214_*k* is configured to introduce an individual amount of delay to the signal from the input terminal 211**.

Figure 3C:
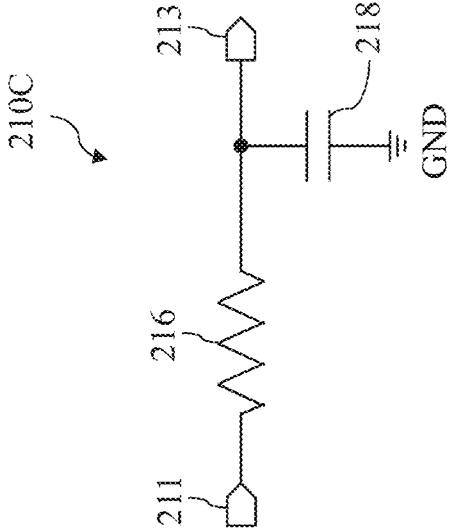
FIG. 3C is a circuit diagram of a delay cell, in accordance with some embodiments of the present disclosure.

FIG. 3C is a circuit diagram of a delay cell 210C, in accordance with some embodiments of the present disclosure. The delay cell 210C includes a resistor 216 and a capacitor 218. The resistor 216 is coupled between the input terminal 211 and the output terminal 213, and the capacitor 218 is coupled between the output terminal 213 and a ground GND. The delay cell 210C is configured to introduce an amount of delay to the signal from the input terminal 211 that is determined by the resistance of the resistor 216 and the capacitance of the capacitor 218.

Figure 4B:
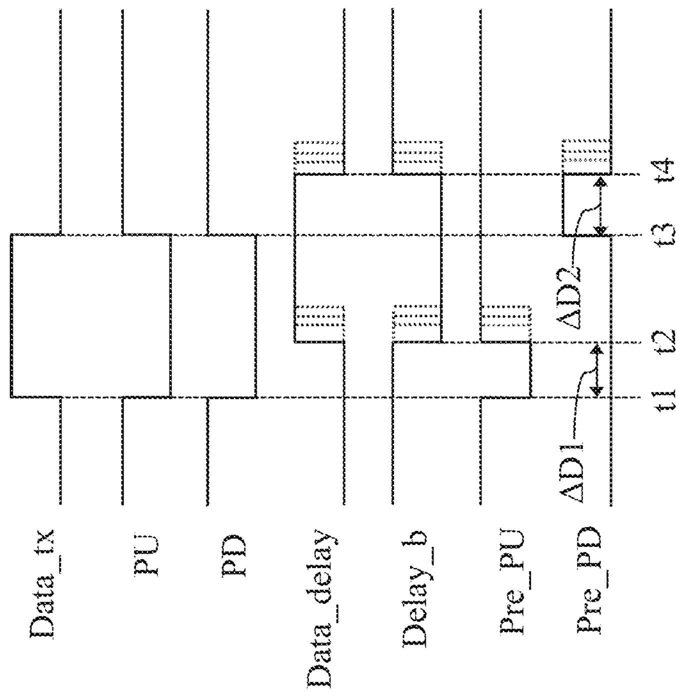
FIGS. 4A and 4B are respectively a circuit diagram and a waveform of a control circuit, in accordance with some embodiments of the present disclosure.
Figure 4A:
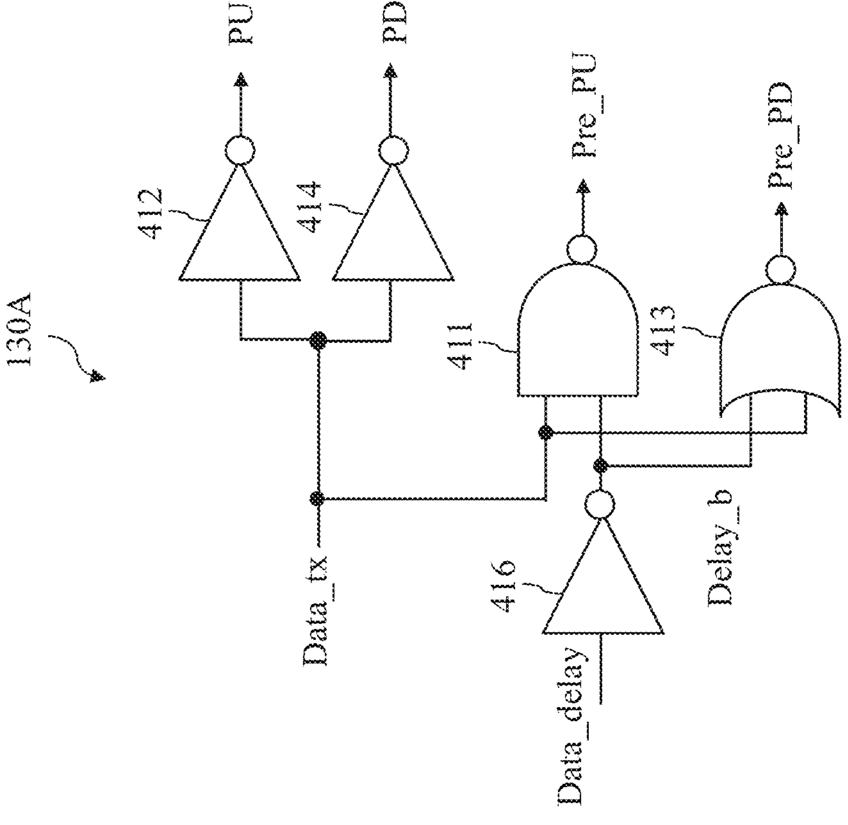

FIGS. 4A and 4B are respectively a circuit diagram and a waveform of a control circuit 130A, in accordance with some embodiments of the present disclosure. The control circuit 130A includes the inverters 412, 414 and 416, the NAND gate 411 and the NOR gate 413. The inverters 412, 414 and 416, the NAND gate 411 and the NOR gate 413 are powered by the power supply voltage VDD. The inverter 412 is configured to invert the signal Data_tx to generate the control signal PU. Similarly, the inverter 414 is configured to invert the signal Data_tx to generate the control signal PD. For example, when the signal Data_tx rises (e.g., changes from a low voltage level to a high voltage level) at time t1, the control signals PU and PD fall (e.g., changes from a high voltage level to a low voltage level). In some embodiments, the low voltage is a power supply voltage VSS, and the high voltage is a power supply voltage VDD.

The inverter 416 is configured to invert the signal Data_delay to generate the signal Delay_b. As described above, the signal Data_delay is provided by the delay circuit 110. In the embodiment of FIGS. 4A and 4B, the delay circuit 110 is configured to delay the signal Data_tx having a rising edge at time t1 to provide the signal Data_delay having a rising edge at time t2. In other words, the delay circuit 110 is configured to provide a delay amount ΔD1 to the rising edge of the signal Data_tx to generate the rising edge of the signal Data_delay, where ΔD1=t2−t1. Furthermore, the delay amount ΔD1 is variable (as shown by the dotted lines), and is controlled by the delay circuit 110. Furthermore, the delay circuit 110 is configured to delay the signal Data_tx having a falling edge at time t3 to provide the signal Data_delay having a falling edge at time t4. In other words, the delay circuit 110 is configured to provide a delay amount ΔD2 to the falling edge of the signal Data_tx to generate the falling edge of the signal Data_delay, where ΔD2=t4−t3. Furthermore, the delay amount ΔD2 is variable (as shown by the dotted lines), and is controlled by the delay circuit 110. In some embodiments, the delay amount ΔD1 is equal to the delay amount ΔD2, i.e., the rising edge and falling edge of the signal Data_tx are synchronously delayed. In some embodiments, the delay amount ΔD1 is different from the delay amount ΔD2, i.e., he rising edge and falling edge of signal Data_tx are asynchronously delayed.

The NAND gate 411 is configured to generate the control signal Pre_PU according to the signal Data_tx and the signal Delay_b. When the signal Data_tx and the signal Delay_b are both at a high voltage level (e.g., VDD), the control signal Pre_PU is at a low voltage level (e.g., VSS). Therefore, the control signal Pre_PU is at a low voltage level from time t1 to time t2. In other words, the control signal Pre_PU is at a low voltage level from a rising edge of the signal Data_tx to a rising edge of the signal Data_delay. The NOR gate 413 is configured to generate the control signal Pre_PD according to the signal Data_tx and the signal Delay_b. When the signal Data_tx and the signal Delay_b are both at a low voltage level (e.g., VSS), the control signal Pre_PD is at a high voltage level (e.g., VDD). Therefore, the control signal Pre_PD is at a high voltage level from time t3 to time t4. In other words, the control signal Pre_PD is at a high voltage level from a falling edge of the signal Data_tx to a falling edge of the signal Data_delay. As shown in FIG. 4B, the control signals PU and PD are the same, and the control signals Pre_PD and Pre_PU are different.

Figure 5B:
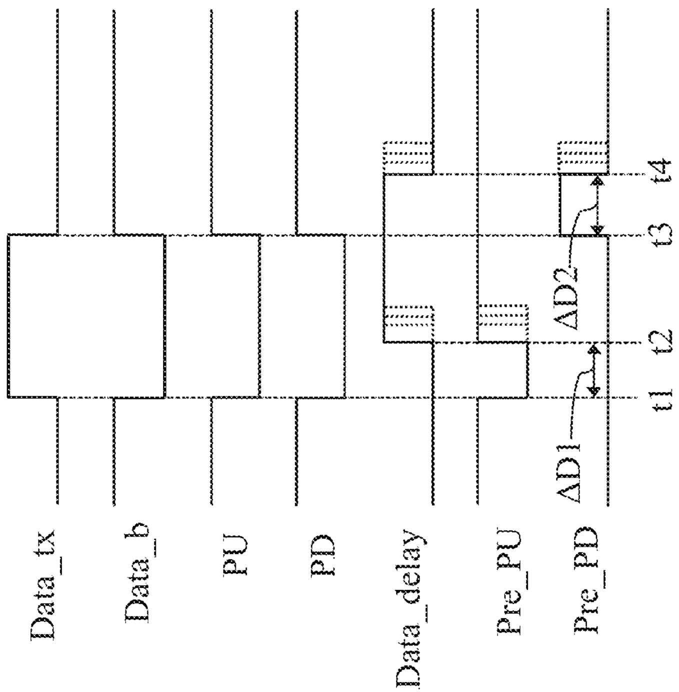
FIGS. 5A and 5B are respectively a circuit diagram and a waveform of a control circuit, in accordance with some embodiments of the present disclosure.
Figure 5A:
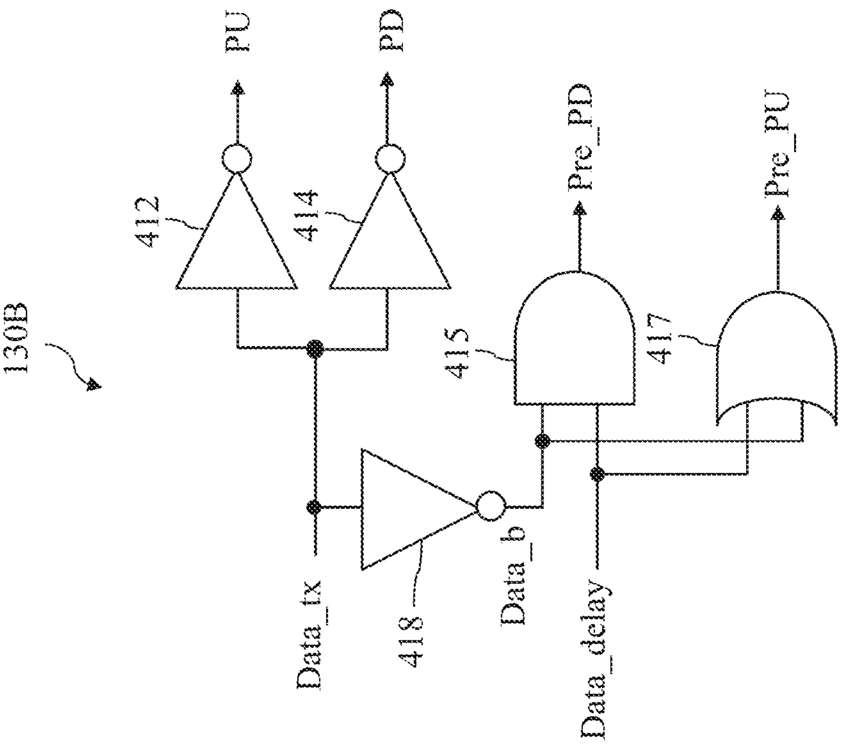

FIGS. 5A and 5B are respectively a circuit diagram and a waveform of a control circuit 130B, in accordance with some embodiments of the present disclosure. The control circuit 130B includes the inverters 412, 414 and 418, the AND gate 415 and the OR gate 417. The inverters 412, 414 and 418, the AND gate 415 and the OR gate 417 are powered by the power supply voltage VDD. The inverter 412 is configured to invert the signal Data_tx to generate the control signal PU. Similarly, the inverter 414 is configured to invert the signal Data_tx to generate the control signal PD. The inverter 418 is configured to invert the signal Data_tx to generate the signal Data_b.

As described above, the signal Data_delay is provided by the delay circuit 110. In the embodiment of FIGS. 5A and 5B, the delay circuit 110 is configured to delay the signal Data_tx having a rising edge at time t1 to provide the signal Data_delay having a rising edge at time t2. In other words, the delay circuit 110 is configured to provide a delay amount ΔD1 to the rising edge of the signal Data_tx to generate the rising edge of the signal Data_delay, where ΔD1=t2−t1. Furthermore, the delay circuit 110 is configured to delay the signal Data_tx having a falling edge at time t3 to provide the signal Data_delay having a falling edge at time t4. In other words, the delay circuit 110 is configured to provide a delay amount ΔD2 to the falling edge of the signal Data_tx to generate the falling edge of the signal Data_delay, where ΔD2=t4−t3. As described above, the delay amount ΔD1 may be equal to or different from the delay amount ΔD2.

The AND gate 415 is configured to generate the control signal Pre_PD according to the signal Data_b and the signal Data_delay. When the signal Data_b and the signal Data_delay are both at a high voltage level (e.g., VDD), the control signal Pre_PD is at a high voltage level. Therefore, the control signal Pre_PD is at a high voltage level from time t3 to time t4. In other words, the control signal Pre_PD is at a high voltage level from a falling edge of the signal Data_tx to a falling edge of the signal Data_delay. The OR gate 417 is configured to generate the control signal Pre_PU according to the signal Data_b and the signal Data_delay. When the signal Data_b and the signal Data_delay are both at a low voltage level (e.g., VSS), the control signal Pre_PU is at a low voltage level (e.g., VDD). Therefore, the control signal Pre_PU is at a low voltage level from time t1 to time t2. In other words, the control signal Pre_PU is at a low voltage level from a rising edge of the signal Data_tx to a rising edge of the signal Data_delay.

Figure 6A:
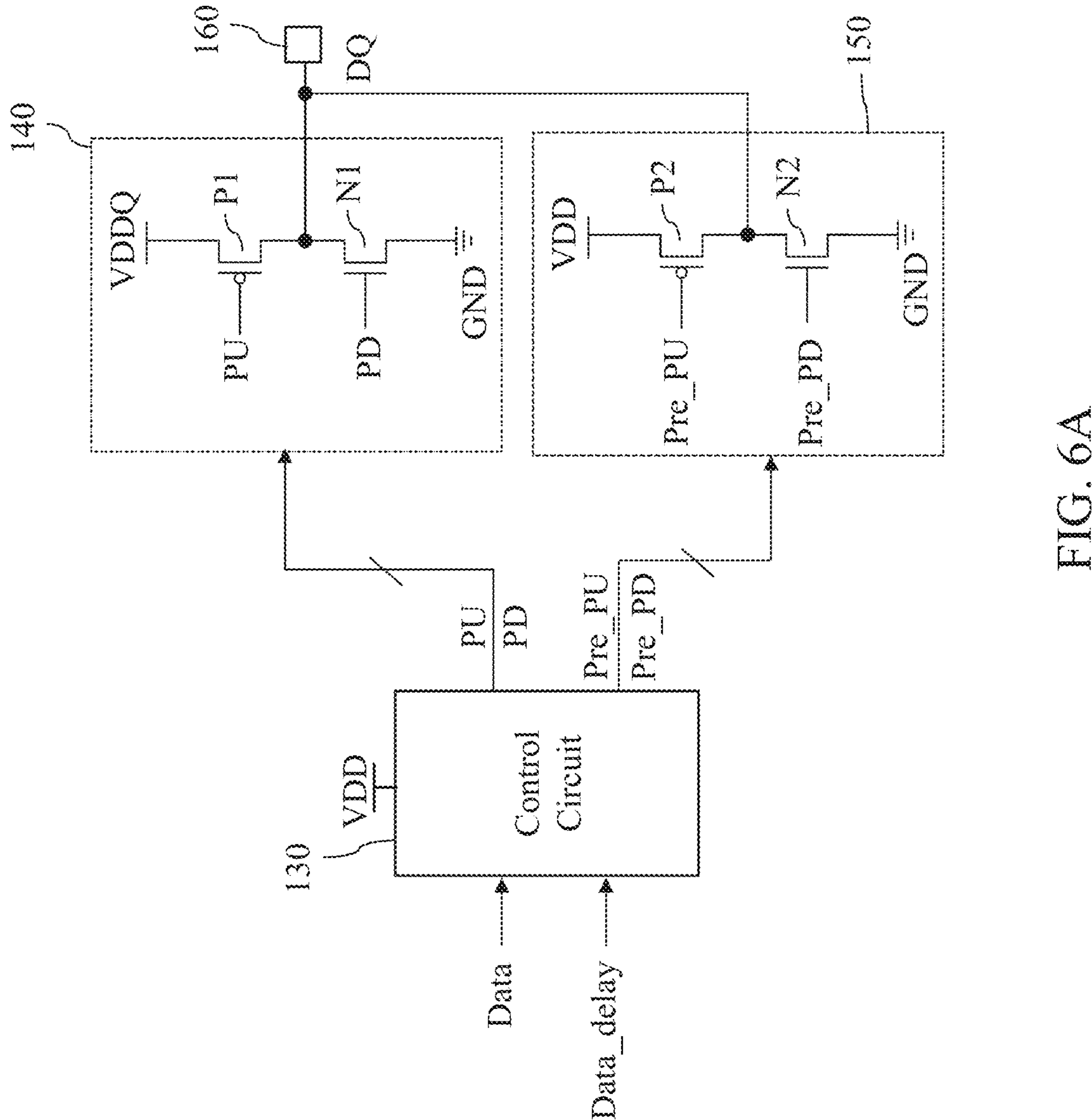
FIGS. 6A and 6B are respectively a circuit diagram and a waveform of the low-voltage driver and the pre-emphasis driver, in accordance with some embodiments of the present disclosure.
Figure 6B:
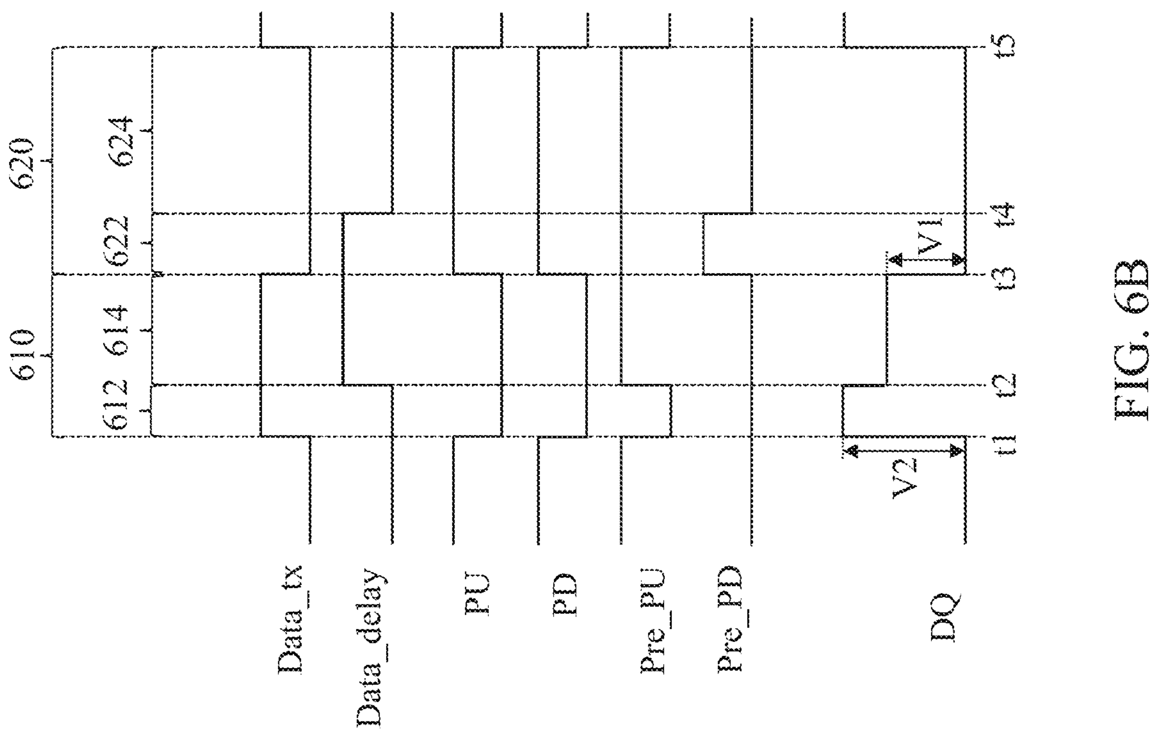

FIGS. 6A and 6B are respectively a circuit diagram and a waveform of the low-voltage driver 140 and the pre-emphasis driver 150, in accordance with some embodiments of the present disclosure. The low-voltage driver 140 includes a P-type transistor P1 and an N-type transistor N1. Similarly, the pre-emphasis driver 150 includes a P-type transistor P2 and an N-type transistor N2. In some embodiments, the P-type transistors P1 and P2 have the same size, and the N-type transistors N1 and N2 have the same size. In some embodiments, the P-type transistors P1 and P2 have different sizes, and the N-type transistors N1 and N2 have different sizes.

In the low-voltage driver 140, the P-type transistor P1 is coupled between a line of the power supply voltage VDDQ and the pad 160. A gate of the P-type transistor P1 is coupled to the control circuit 130 for receiving the control signal PU. When the control signal PU is at a low voltage level (e.g., VSS), the P-type transistor P1 is turned on. When the control signal PU is at a high voltage level (e.g., VDD), the P-type transistor P1 is turned off. The N-type transistor N1 is coupled between the ground GND and the pad 160. A gate of the N-type transistor N1 is coupled to the control circuit 130 for receiving the control signal PD. When the control signal PD is at a low voltage level (e.g., VSS), the N-type transistor N1 is turned off. When the control signal PD is at a high voltage level (e.g., VDD), the N-type transistor N1 is turned on. It should be noted that the power supply voltage VDDQ is less than the power supply voltage VDD, i.e., VDDQ<VDD.

In the pre-emphasis driver 150, the P-type transistor P2 is coupled between a line of the power supply voltage VDD and the pad 160. A gate of the P-type transistor P2 is coupled to the control circuit 130 for receiving the control signal Pre_PU. When the control signal Pre_PU is at a low voltage level (e.g., VSS), the P-type transistor P2 is turned on. When the control signal Pre_PU is at a high voltage level (e.g., VDD), the P-type transistor P2 is turned off. The N-type transistor N2 is coupled between the ground GND and the pad 160. A gate of the N-type transistor N2 is coupled to the control circuit 130 for receiving the control signal Pre_PD. When the control signal Pre_PD is at a low voltage level (e.g., VSS), the N-type transistor N2 is turned off. When the control signal Pre_PD is at a high voltage level (e.g., VDD), the N-type transistor N2 is turned on.

As described in the control circuit 130A of FIGS. 4A and 4B and the control circuit 130B of FIGS. 5A and 5B, the control signals PD and PU are generated according to the signal Data_tx, and the control signals Pre_PD and Pre_PU are generated according to the signal Data_tx and the signal Data_delay. In some embodiments, the control signals PD and PU are the inverse of the signal Data_tx.

In the embodiment of FIGS. 6A and 6B, the signal Data_tx is at a high voltage level (e.g., VDD) from time t1 to time t3, and the signal Data_delay is at a high voltage level (e.g., VDD) from time t2 to time t4. In response to the signal Data_tx, the signals PU and PD are at a low voltage level (e.g., VSS) from time t1 to time t3. Furthermore, In response to the signal Data_tx and the signal Data_delay, the control signal Pre_PU is at a low voltage level (e.g., VSS) from time t1 to time t2, and the control signal Pre_PD is at a high voltage level (e.g., VDD) from time t3 to time t4. As shown in FIG. 6B, the control signals PD and PU have the same waveform, i.e., the control signal PD is equal to the control signal PU, and the control signal Pre_PD is different from the control signal Pre_PU.

First, the driving circuit 100 enters a pull-up phase 610 (i.e., from time t1 to time t3), the control signal PU is at a low voltage level (e.g., VSS), and the P-type transistor P1 is turned on by the control signal PU. Thus, the power supply voltage VDDQ is provided to the pad 160 through the turned on P-type transistor P1. Furthermore, from time t1 to time t2, the control signal Pre_PU is at a low voltage level (e.g., VSS), and the P-type transistor P2 is turned on by the control signal Pre_PU. Thus, the power supply voltage VDD is simultaneously provided to the pad 160 through the turned on P-type transistor P2. Therefore, the output signal DQ of the pad 160 has a voltage level V2 in a pre-emphasis pull-up phase 612 (i.e., from time t1 to time t2) because both the P-type transistors P1 and P2 are turned on in the pre-emphasis pull-up phase 612. After the pre-emphasis pull-up phase 612 is completed, the driving circuit 100 enters a normal pull-up phase 614 (i.e., from time t2 to time t3). In the normal pull-up phase 614, the P-type transistor P2 is turned off, and the output signal DQ of the pad 160 is changed from the voltage level V2 to the voltage level V1. The voltage level V2 is greater than the voltage level V1. In some embodiments, the voltage level V1 is substantially equal to the power supply voltage VDDQ, and the voltage level V2 is substantially equal to the power supply voltage VDD or between the power supply voltages VDDQ and VDD depended on a ratio of the pre-emphasis pull-up phase 612 and the pull-up phase 610 and RC effect between the pad 160 and the specific device. For example, when the ratio of the pre-emphasis pull-up phase 612 and the pull-up phase 610 is increased, the voltage level V2 is closer to the power supply voltage VDD. In addition, the driving circuit 100 only increases the drive strength in the pre-emphasis pull-up phase 612, thus decreasing power consumption compared to increasing the drive strength in the pull-up phase 610. In some embodiments, the ratio of the pre-emphasis pull-up phase 612 and the pull-up phase 610 is in a range about from 20% to about 50%.

After the pull-up phase 610 is completed, the driving circuit 100 enters a pull-down phase 620 (i.e., from time t3 to time t5). In the pull-down phase 620, the control signal PD is at a high voltage level (e.g., VDD), and the N-type transistor N1 is turned on by the control signal PD. Thus, the pad 160 is coupled to the ground GND through the turned on N-type transistor N1. Furthermore, from time t3 to time t4, the control signal Pre_PD is at a high voltage level (e.g., VDD), and the N-type transistor N2 is turned on by the control signal Pre_PD. Thus, the pad 160 is coupled to the ground GND through the turned on N-type transistor N2. Therefore, the output signal DQ of the pad 160 has a voltage level VSS in a pre-emphasis pull-down phase 622 (i.e., from time t3 to time t4) because both the N-type transistors N1 and N2 are turned on in the pre-emphasis pull-down phase 622. After the pre-emphasis pull-down phase 622 is completed, the driving circuit 100 enters a normal pull-down phase 624 (i.e., from time t4 to time t5). In the normal pull-down phase 624, the N-type transistor N2 is turned off, and the output signal DQ of the pad 160 is maintained at the voltage level VSS. In some embodiments, the ratio of the pre-emphasis pull-down phase 622 and the pull-down phase 620 is in a range about from 20% to about 50%.

Figure 7:
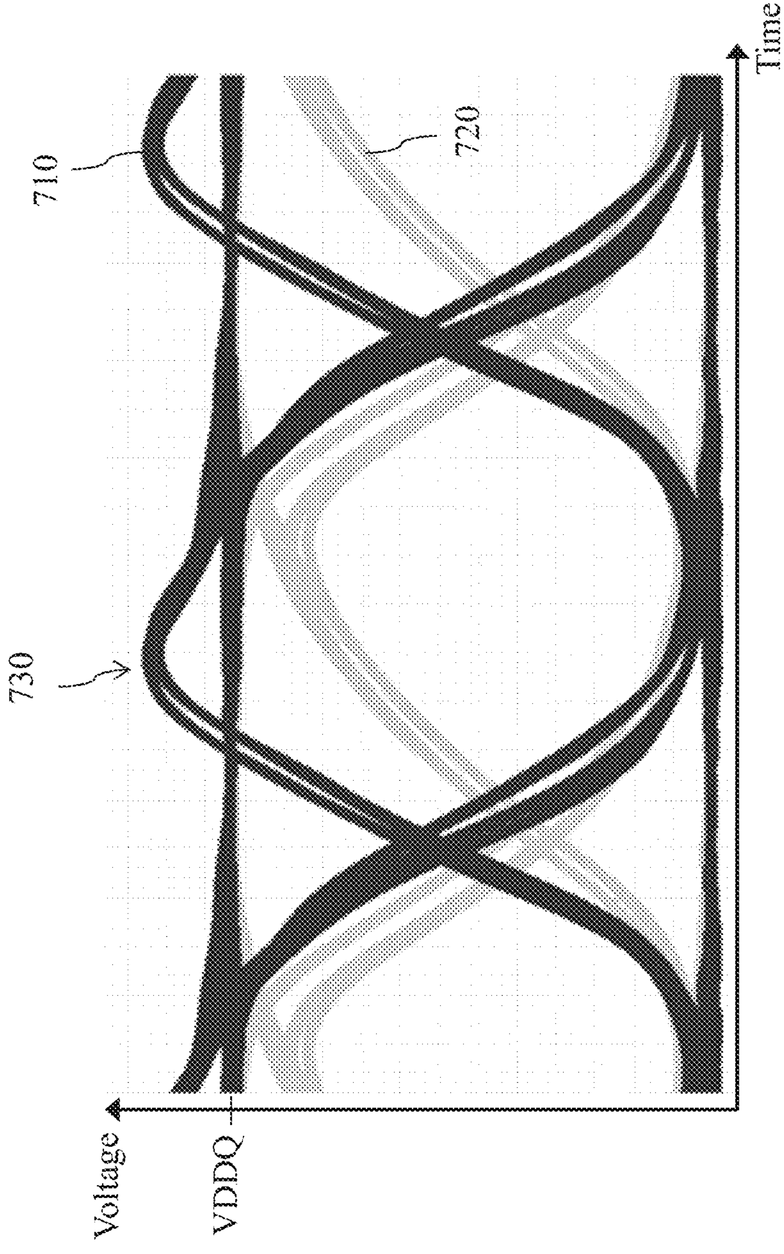
FIG. 7 is an eye diagram of the signal in the pad, in accordance with some embodiments of the present disclosure.

FIG. 7 is an eye diagram of the signal DQ in the pad 160, in accordance with some embodiments of the present disclosure. Curve 710 represents result of the signal DQ in the driving circuit 100 with the pre-emphasis driver 150 (i.e., the pre-emphasis driver 150 is enabled), and curve 720 represents result of the signal DQ in the driving circuit 100 without the pre-emphasis driver 150 (i.e., the pre-emphasis driver 150 is disabled). By using the pre-emphasis driver 150, the pull-up phase 610 and the pull-down phase 620 are pre-emphasized, and the slopes of rising edge and falling edge of the signal DQ are steeper. Therefore, the curve 710 has higher eye height and wider eye width than the curve 720. In other words, the eye opening of the curve 710 is greater than the eye opening of the curve 720. Furthermore, the pre-emphasis driver 150 is configured to provide the power supply voltage VDD (higher than the power supply voltage VDDQ) to the pad 160 during the pre-emphasis pull-up phase 612. Thus, the curve 710 has a higher voltage level than the power supply voltage VDDQ, as shown in label 730.

Figure 8:
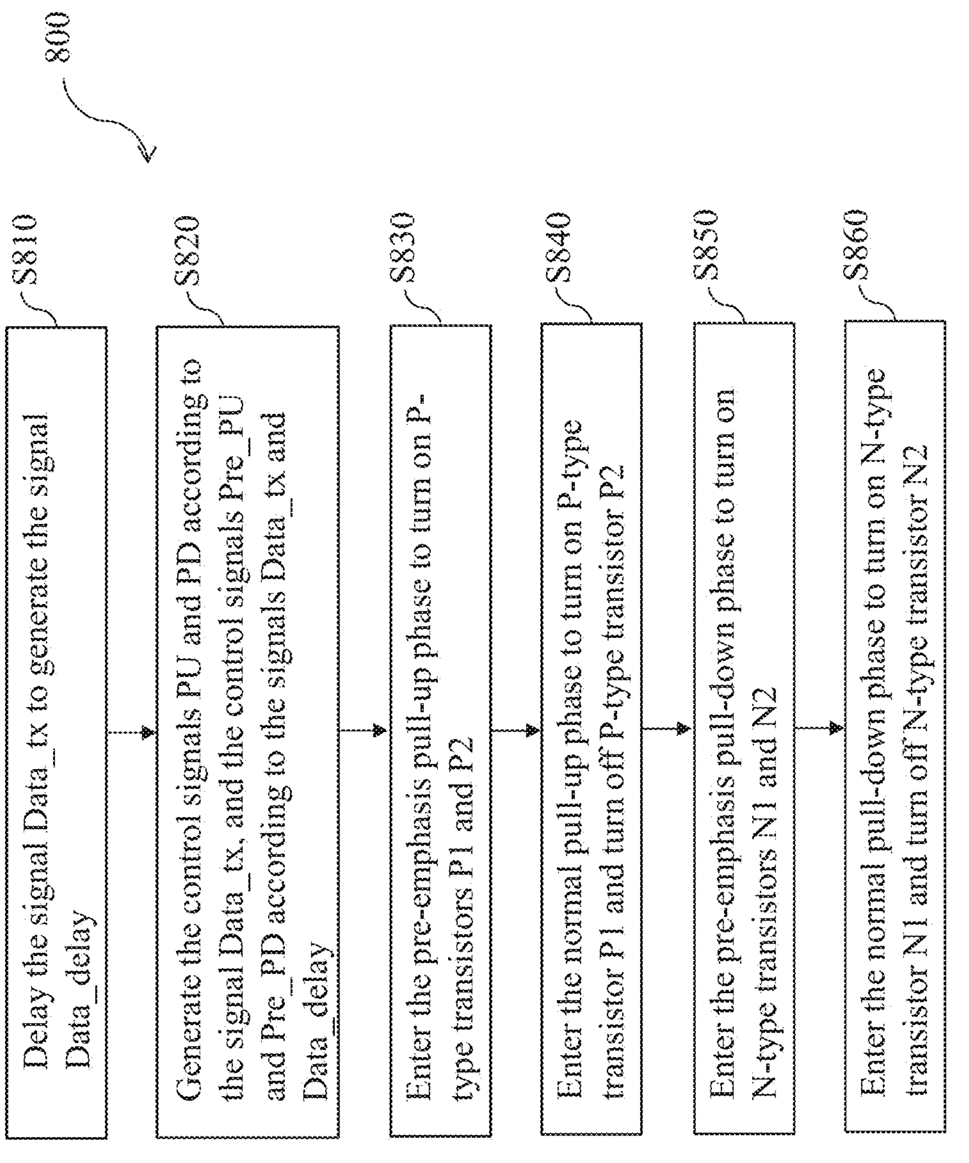
FIG. 8 is a pre-emphasis driving method, in accordance with some embodiments of the present disclosure.

FIG. 8 is a pre-emphasis driving method 800, in accordance with some embodiments of the present disclosure. The pre-emphasis driving method 800 is performed by the driving circuit 100 of FIG. 1.

First, in operation S810, the signal Data_tx to be transmitted to a specific device through the pad 160 is obtained and delayed by the delay circuit 110, so as to generate the signal Data_delay.

In operation S820, the control circuit 130 is configured to generate the control signals PU and PD of the low-voltage driver 140 according to the signal Data_tx, and generate the control signals Pre_PU and Pre_PD of the pre-emphasis driver 150 according to the signal Data_tx and the signal Data_delay.

In operation S830, the driving circuit 100 enters the pre-emphasis pull-up phase 612 when the signal Data_tx is at a high voltage level and the signal Data_delay is at a low voltage level. In the pre-emphasis pull-up phase 612, the P-type transistor P1 of the low-voltage driver 140 is turned on and the P-type transistor P2 of the pre-emphasis driver 150 is also turned on, and both the power supply voltage VDD and the power supply voltage VDDQ are provided to the pad 160.

In operation S840, the driving circuit 100 enters the normal pull-up phase 614 when the signals Data_tx and Data_delay are at a high voltage level. In the normal pull-up phase 614, the P-type transistor P1 of the low-voltage driver 140 is turned on and the P-type transistor P2 of the pre-emphasis driver 150 is turned off, and only the power supply voltage VDDQ is provided to the pad 160.

In operation S850, the driving circuit 100 enters the pre-emphasis pull-down phase 622 when the signal Data_tx is at a low voltage level and the signal Data_delay is at a high voltage level. In the pre-emphasis pull-down phase 622, the N-type transistor N1 of the low-voltage driver 140 is turned on and the N-type transistor N2 of the pre-emphasis driver 150 is also turned on, and the pad 160 is coupled to the ground GND through both the low-voltage driver 140 and the pre-emphasis driver 150.

In operation S860, the driving circuit 100 enters the normal pull-down phase 624 when the signals Data_tx and Data_delay are at a low voltage level. In the normal pull-down phase 624, the N-type transistor N1 of the low-voltage driver 140 is turned on and the N-type transistor N2 of the pre-emphasis driver 150 is turned off, and the pad 160 is coupled to the ground GND only through the low-voltage driver 140.

According to some embodiments, a driving circuit is provided. The driving circuit includes a delay circuit, a control circuit, a first driver and a second driver. The delay circuit is configured to generate a delayed first signal by introducing a delay to a first signal. The control circuit is configured to provide a first control signal and a second control signal according to the first signal, and provide a third control signal and a fourth control signal according to the first signal and the delayed first signal. The first driver is coupled to a pad and controlled by the first and second control signals. The second driver is coupled to the pad and controlled by the third and fourth control signals. The delay circuit, the control circuit and the second driver are configured to be powered by a first power supply voltage, and the first driver is configured to be powered by a second power supply voltage less than the first power supply voltage. The first and second control signals are the same, and the third and fourth control signals are different.

According to some embodiments, a driving circuit is provided. The driving circuit includes a delay circuit, a control circuit, a first driver and a second driver. The delay circuit is configured to generate a delayed first signal by introducing a delay to a first signal. The control circuit is configured to provide a first control signal and a second control signal according to the first signal, and provide a third control signal and a fourth control signal according to the first signal and the delayed first signal. The first driver includes a first P-type transistor coupled between a line of a first power supply voltage and a pad, and having a gate receiving the first control signal, and a first N-type transistor coupled between a ground and the pad, and having a gate receiving the second control signal. The second driver includes a second P-type transistor coupled between a line of a second power supply voltage and the pad, and having a gate receiving the third control signal, and a second N-type transistor coupled between the ground and the pad, and having a gate receiving the fourth control signal. The second power supply voltage less than the first power supply voltage, and the first and second control signals are the same, and the third and fourth control signals are different.

According to some embodiments, a pre-emphasis driving method for a driving circuit is provided. The driving circuit includes a first driver and a second driver. The first driver includes a first P-type transistor coupled between a line of a first power supply voltage and a pad and a first N-type transistor coupled between a ground and the pad, and the second driver includes a second P-type transistor coupled between a line of a second power supply voltage and the pad and a second N-type transistor coupled between a ground and the pad. The pre-emphasis driving method includes:

generating a delayed first signal by delaying a first signal through a delay circuit; generating a first control signal and a second control signal to the first driver of the driving circuit according to the first signal; generating a third control signal and a fourth control signal to the second driver of the driving circuit according to the first signal and the delayed first signal; turning on the first P-type transistor by the first control signal and turning on the second P-type transistor by the third control signal when the first signal is at a high voltage level and the delayed first signal is at a low voltage level; turning on the first P-type transistor by the first control signal and turning off the second P-type transistor by the third control signal when the first signal and the delayed first signal are at a high voltage level; and turning on the first N-type transistor by the second control signal and turning on the second N-type transistor by the fourth control signal when the first signal is at the low voltage level and the delayed first signal is at the high voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A driving circuit, comprising:

a delay circuit configured to generate a delayed first signal by introducing a delay to a first signal;

a control circuit configured to provide a first control signal and a second control signal according to the first signal, and provide a third control signal and a fourth control signal according to the first signal and the delayed first signal;

a first driver coupled to a pad and controlled by the first and second control signals; and a second driver coupled to the pad and controlled by the third and fourth control signals, wherein the delay circuit, the control circuit and the second driver are configured to be powered by a first power supply voltage, and the first driver is configured to be powered by a second power supply voltage less than the first power supply voltage, wherein the first and second control signals are the same, and the third and fourth control signals are different.

2. The driving circuit of claim 1, wherein the first driver comprises:

a first P-type transistor coupled between a line of the first power supply voltage and the pad, and controlled by the first control signal; and a first N-type transistor coupled between a ground and the pad, and controlled by the second control signal.

3. The driving circuit of claim 1, wherein the second driver comprises:

a second P-type transistor coupled between a line of the second power supply voltage and the pad, and controlled by the third control signal; and a second N-type transistor coupled between a ground and the pad, and controlled by the fourth control signal.

4. The driving circuit of claim 1, wherein the control circuit is configured to invert the first signal to generate the first and second control signals.

5. The driving circuit of claim 1, wherein the control circuit is configured to provide the third control signal at a low voltage level from a rising edge of the first signal to a rising edge of the delayed first signal, and the control circuit is configured to provide the fourth control signal at a high voltage level from a falling edge of the first signal to a falling edge of the delayed first signal.

6. The driving circuit of claim 1, wherein the delay circuit comprises:

a digitally controlled delay line (DCDL) comprising a plurality of delay cells connected in series, and configured to receive the first signal; and a multiplexer configured to select an output of one of the delay cells as the delayed first signal according to a selection signal.

7. The driving circuit of claim 6, wherein each of the delay cells is configured to introduce a constant amount of delay to the first signal.

8. The driving circuit of claim 6, wherein each of the delay cells is configured to introduce an individual amount of delay to the first signal.

9. The driving circuit of claim 1, wherein the control circuit comprises:

a first inverter configured to receive the first signal and generate the first control signal;

a second inverter configured to receive the first signal and generate the second control signal;

a third inverter configured to receive the delayed first signal and generate a second signal;

a NAND gate configured to receive the first and second signals to generate the third control signal; and a NOR gate configured to receive the first and second signals to generate the fourth control signal.

10. The driving circuit of claim 1, wherein the control circuit comprises:

a first inverter configured to receive the first signal and generate the first control signal;

a second inverter configured to receive the first signal and generate the second control signal;

a third inverter configured to receive the first signal and generate a second signal;

an AND gate configured to receive the second signal and the delayed first signal to generate the third control signal; and an OR gate configured to receive the second signal and the delayed first signal to generate the fourth control signal.

11. A driving circuit, comprising:

a delay circuit configured to generate a delayed first signal by introducing a delay to a first signal;

a control circuit configured to provide a first control signal and a second control signal according to the first signal, and provide a third control signal and a fourth control signal according to the first signal and the delayed first signal;

a first driver, comprising:

a first P-type transistor coupled between a line of a first power supply voltage and a pad, and having a gate receiving the first control signal; and a first N-type transistor coupled between a ground and the pad, and having a gate receiving the second control signal; and a second driver, comprising:

a second P-type transistor coupled between a line of a second power supply voltage and the pad, and having a gate receiving the third control signal; and a second N-type transistor coupled between the ground and the pad, and having a gate receiving the fourth control signal, wherein the second power supply voltage is less than the first power supply voltage, and the first and second control signals are the same, and the third and fourth control signals are different.

12. The driving circuit of claim 11, wherein the control circuit is configured to invert the first signal to generate the first and second control signals.

13. The driving circuit of claim 11, wherein the control circuit is configured to provide the third control signal at a low voltage level from a rising edge of the first signal to a rising edge of the delayed first signal, and the control circuit is configured to provide the fourth control signal at a high voltage level from a falling edge of the first signal to a falling edge of the delayed first signal.

14. The driving circuit of claim 11, wherein the delay circuit comprises:

a digitally controlled delay line (DCDL) comprising a plurality of delay cells connected in series, and configured to receive the first signal; and a multiplexer configured to select an output of one of the delay cells as the delayed first signal according to a selection signal.

15. The driving circuit of claim 14, wherein each of the delay cells is configured to introduce a constant amount of delay to the first signal.

16. The driving circuit of claim 14, wherein each of the delay cells is configured to introduce an individual amount of delay to the first signal.

17. The driving circuit of claim 11, wherein the control circuit comprises:

a first inverter configured to receive the first signal and provide the first control signal;

a second inverter configured to receive the first signal and provide the second control signal;

a third inverter configured to receive the delayed first signal and provide a second signal;

a NAND gate configured to receive the first and second signals to provide the third control signal; and a NOR gate configured to receive the first and second signals to provide the fourth control signal.

18. The driving circuit of claim 11, wherein the control circuit comprises:

a first inverter configured to receive the first signal and provide the first control signal;

a second inverter configured to receive the first signal and provide the second control signal;

a third inverter configured to receive the first signal and provide a second signal;

an AND gate configured to receive the second signal and the delayed first signal to provide the third control signal; and an OR gate configured to receive the second signal and the delayed first signal to provide the fourth control signal.

19. A pre-emphasis driving method for a driving circuit, comprising:

generating a delayed first signal by delaying a first signal through a delay circuit;

generating a first control signal and a second control signal to a first driver of the driving circuit according to the first signal, wherein the first driver comprises a first P-type transistor coupled between a line of a first power supply voltage and a pad, and a first N-type transistor coupled between the ground and the pad;

generating a third control signal and a fourth control signal to a second driver of the driving circuit according to the first signal and the delayed first signal, wherein the second driver comprises a second P-type transistor coupled between a line of a second power supply voltage and the pad, and a second N-type transistor coupled between a ground and the pad;

turning on the first P-type transistor by the first control signal and turning on the second P-type transistor by the third control signal when the first signal is at a high voltage level and the delayed first signal is at a low voltage level;

turning on the first P-type transistor by the first control signal and turning off the second P-type transistor by the third control signal when the first signal and the delayed first signal are at the high voltage level; and turning on the first N-type transistor by the second control signal and turning on the second N-type transistor by the fourth control signal when the first signal is at the low voltage level and the delayed first signal is at the high voltage level.

20. The pre-emphasis driving method of claim 19, wherein generating the third control signal and the fourth control signal to the second driver of the driving circuit according to the first signal and the delayed first signal further comprises:

providing the third control signal at the low voltage level from a rising edge of the first signal to a rising edge of the delayed first signal; and providing the fourth control signal at the high voltage level from a falling edge of the first signal to a falling edge of the delayed first signal.

* * * * *